United States Patent [19]

Cukauskas

[11] 4,439,269

[45] Mar. 27, 1984

[54] METHOD FOR MAKING JOSEPHSON JUNCTIONS WITH CONTAMINATION-FREE INTERFACES UTILIZING A ZNO CONTACT INSULATOR

[75] Inventor: Edward J. Cukauskas, Vienna, Va.

[73] Assignee: The United States of America as represented by the Secretary of the Navy, Washington, D.C.

[21] Appl. No.: 431,977

[22] Filed: Sep. 30, 1982

[51] Int. Cl.$^3$ ............................................. H01L 39/24
[52] U.S. Cl. ......................................... 156/643; 29/599; 156/652; 156/655; 204/192 E; 204/192 S; 357/5; 427/62; 427/86
[58] Field of Search ............... 156/643, 652, 655; 204/192 SE; 427/62, 86, 255.7; 357/5; 29/599

[56] References Cited

U.S. PATENT DOCUMENTS

| | | | |
|---|---|---|---|
| 2,982,002 | 5/1961 | Shockley | 29/578 |
| 3,795,557 | 3/1974 | Jacob | 252/79.1 |
| 4,176,365 | 11/1979 | Kroger | 357/5 |
| 4,220,959 | 9/1980 | Kroger | 357/5 |
| 4,264,409 | 4/1981 | Forget et al. | 156/662 |
| 4,299,679 | 11/1981 | Suzuui | 204/192 EC |
| 4,341,818 | 7/1982 | Adams et al. | 427/255.7 |
| 4,370,359 | 1/1983 | Fetter et al. | 427/255.7 |

OTHER PUBLICATIONS

Aspen et al., "Superconducting . . . Barriers", Cryogenics, vol. 16, No. 11 (12176) pp. 721-722.
Broom et al., "Niokium . . . Junction", IEEE Transactions on Electron Devices, vol. 27, No. 10 (10/80) pp. 1998-2008.
Broom et al., "Pb-Alloy . . . Etching", IBM Technical Disclosure Bulletin, vol. 19, No. 7 (12/76) p. 2727.
Reible, "Reactive . . . Junctions" IEEE Transactions on Magnetics, vol. 17, No. 1 (1/81) pp. 303-306.
Cukauskas, Niobium Nitride Josephson Tunnel Junctions, Bulletin of the American Physical Society, vol. 27, p. 205, Mar. 1982.
Kroger et al., Selective Niobium Anodization Process for Fabricating Josephson Tunnel Junctions, Applied Physics Letter, vol. 39, pp. 280-282, 1981.

*Primary Examiner*—Jerome W. Massie
*Attorney, Agent, or Firm*—Robert F. Beers; William T. Ellis; Charles S. Guenzer

[57] ABSTRACT

A method of fabricating Josephson junction integrated circuits in which the active layers are deposited within an ultra-high vacuum system during a single pumpdown of the system. Subsequent anisotropic etching defines the devices by etching away complete layers in some areas so as to isolate the Josephson junction device.

5 Claims, 10 Drawing Figures

METHOD FOR MAKING JOSEPHSON JUNCTIONS WITH CONTAMINATION-FREE INTERFACES UTILIZING A ZNO CONTACT INSULATOR

FIELD OF THE INVENTION

This invention relates, in general, to a method of fabricating Josephson junctions and, in particular, to a fabrication method that prevents interfacial contamination.

The fabrication of Josephson junction devices requires close regard to clean interfaces. The barrier between the two superconducting electrodes is only a few nanometers thick corresponding to one or two atomic layers. As a result, defects or contaminants of atomic size can affect the electronic characteristics of the Josephson junctions. Important characteristics of these junctions are often on the order of millivolts so that interface potentials must be closely controlled. Furthermore, defects at interfaces tend to be stable at room temperature and below. The high temperature treatment necessary to anneal many of these defects is incompatible with the metallurgy of the sharply defined layered structure of Josephson junctions.

Josephson junctions normally consist of a base electrode composed of a layer of superconducting material deposited on a substrate, an insulating layer forming a barrier 1 to 10 nm thick on top of the base electrode, and a counter electrode, also of a superconducting material, deposited on top of the insulating layer. The substrate plus any layers or structures added to it during processing will be called a chip. Typical fabrication techniques have relied on various types of sputtering and evaporation occurring in a vacuum chamber to deposit the superconducting materials. However, the chip has usually been removed from the chamber for processing between depositions. Such interlayer processing is particularly required if an integrated circuit Josephson junction is required because the junction areas need to be defined. Photolithographic techniques are typically used in interlayer processing to prevent depositions on photomasked areas.

The problem with interlayer processing is that the surface of the freshly deposited layer is bound to become contaminated if the chip is removed from the vacuum chamber for processing. Even relatively clean laboratory air contains significant and uncontrollable amounts of water vapor, dust, hydrocarbons and other undesired materials. These rapidly settle on or react with the exposed surface. This surface defines the interface between the two active materials and interfacial contamination at the surface greatly affects the performance and reliability of Josephson junctions. The contamination problems becomes particularly severe for the refractory superconductors, such as niobium and niobium nitride, which readily getter many of the impurities abounding in a laboratory atmosphere or even at moderate vacuums.

The contamination introduced by interlayer processing reduces the designer's control over the interfacial properties of the Josephson junction. Because of contamination, the device characteristics are degraded from the ideal and since the contamination is generally uncontrollable, reproducibility of devices becomes problematic.

Because of the gettering properties of niobium, most niobium and most of its alloys are deposited rapidly to avoid exposure to contamination during film growth. Such rapid growth often causes damage to the surface onto which the deposition is being made. If this surface is then oxidized to form the barrier of the tunnel junctions, microshorts often develop through the barrier because of the damage caused by fast deposition. At other times poor quality junctions are produced with excessive shunt conductance.

The contaminated interface can be cleaned after the chip has been returned to the deposition chamber by sputter etching or ion milling the surface. This procedure removes the contaminants but it also introduces damage on the surface forming the interface, thus altering the device's ideal characteristics.

One method for avoiding interlayer contamination is to deposit two or more layers within an ultra-high vacuum (UHV) chamber without breaking vacuum between depositions. The depositions themselves present relatively few difficulties since independently controlled multiple evaporators or sputtering sources can be provided inside the UHV chamber. However, if multiple layers are to be grown without breaking vacuum for an integrated circuit, some method must be provided which delineates or defines the active area.

One such method is described by E. L. Hu and coauthors in "Ultrasmall Superconducting Tunnel Junctions" in IEEE Transactions on Electron Devices, vol. ED-27, pages 2030-2031, 1980. The disclosed method requires a bridgelike layer of photoresist to be suspended above the substrate. The two electrodes of the Josephson junction are grown by depositing at two different angles with respect to the suspended photoresist. The areas of the substrate on which both electrodes are deposited, with an oxidation in between, become the areas of active junctions. However this method, while offering superior lithographic resolution, is overly complex and provides limited flexibility. Furthermore, this method is not useful when the substrate must be heated because niobium alloys deteriorate at elevated temperatures.

More recently, Kroger, Smith and Jillie have described in Applied Physics Letters, volume 39, pages 280–282, a selective niobium anodization process (SNAP). In SNAP, illustrated in FIG. 1, a substrate 12 is inserted in a clean vacuum chamber. A lower layer 14 of a superconductor such as niobium (Nb) is then deposited over a large area of the substrate. Without vacuum being broken, an insulating layer 16 is grown or deposited on top of the lower superconducting layer 14. Then, again without breaking vacuum, an upper superconducting layer 18 is deposited on top of the insulating layer 16. At this point, there results a large area Josephson junction. The lower interface 20 between the lower superconducting layer 14 and the insulating layer 16 as well as the upper interface 22 between the insulating layer 16 and the upper superconducting layer 18 can be made nearly free of contaminants because the environment within the vacuum chamber during the formation of the interfaces 20 and 22 can be closely controlled. The active areas of an integrated Josephson junction circuit can then be defined by photolithographically depositing a layer of photoresist 24 on top of the upper superconducting layer 18 over the area intended to be the Josephson junction. It is to be understood that multiple Josephson junction devices of perhaps different geometries and with complex interconnections can be simultaneously defined on the same chip. The photolithography and subsequent processing in SNAP can be performed in an environment of reduced cleanliness without contaminating the interfaces 20 and 22 because the electronically important interfaces 20 and 22 have already been formed. In SNAP, the upper surface of the chip is then anodized in a wet process, to a depth somewhat greater than the thickness of the upper superconducting layer 18. However, the photoresist 24 prevents the active area beneath it from being anodized. Subsequently, the photoresist is removed and the structure shown illustrated in FIG. 1b is left. The substrate 12 and lower superconducting layer 14 have been unaffected. The lower superconducting layer 14 forms a common base electrode. The anodization has grown through the upper superconducting layer 18 to leave a counter electrode 26 approximately beneath the photoresist 24. The counter electrode 26 is surrounded by the insulating anodized niobium 28. The barrier layer 16' has been reduced somewhat below the anodization 28 but remains generally untouched beneath the counter electrode 26. The Josephson junction beneath the counter electrode 26 can be contacted to other Josephson junctions formed simultaneously on the same chip.

Although SNAP prevents interface contamination introduced by interlayer processing, it suffers several drawbacks. The wet anodization is itself a dirty process and introduces contamination into the Josephson junction integrated circuit, not necessarily at the interfaces 20 and 22. Furthermore, anodization being a bulk chemical process is isotropic so that the photoresist-defined edge 30 between the anodized Nb 28 and the unanodized Nb counter electrode 26 is neither sharp nor vertical. As a result, the anodization undercuts the counter electroduce 26 in a fairly uncontrollable manner. This indefiniteness of the edge 30 degrades the resolution of the lithographic process and thus limits the feature sizes of the Josephson junction integrated circuit. Finally, the lower superconducting layer 14 has not been isolated between Josephson junctions but acts as a common base electrode to all Josephson junctions on the integrated circuit. The common base electrode reduces design flexibility and its large area introduces parasitic capacitance which slows the operation of the integrated circuit.

SUMMARY OF THE INVENTION

Therefore it is an object to provide a method of fabricating Josephson junctions that produces contamination free interfaces.

It is a further object to provide a method of fabricating Josephson junction integrated circuits that allows the growth of multiple layers without interlayer processing.

It is a yet a further object to provide a method of fabricating Josephson junction integrated circuits that uses clean processing steps.

It is another object to provide a method of fabricating Josephson junction integrated circuits that isolates both counter and base electrodes.

The invention is a method of fabricating Josephson junction integrated circuits as well as other types of electronic devices that prevents contamination of the interfaces caused by interlayer processing, thereby providing more reliable devices with better characteristics. Multiple layers of the materials required for the devices are sequentially deposited onto a substrate within an ultrahigh vacuum system. The layers are deposited during a single pump-down of the vacuum system. The elements of the integrated circuits are then defined and isolated from each other by using anisotropic etching techniques to completely remove one or more of the deposited layers in some areas of the deposited layers.

The invention can be practiced in fabricating Josephson junction integrated circuits by sequentially depositing by RF sputtering within an ultrahigh vacuum chamber a NbN base electrode, a hydrogenated silicon barrier, and a NbN counter electrode. Subsequent device definition is performed by anisotrophic plasma etching and deposition of insulators and superconducting contacts and leads.

BRIEF DESCRIPTION OF THE DRAWINGS

A more complete appreciation of the invention and many of its attendant advantages thereof will be readily obtained as the same becomes better understood by reference to the following detailed description when considered in connection with the accompanying drawings, wherein.

DETAILED DESCRIPTION OF THE DRAWINGS

The process for fabricating Josephson junctions of this invention comprises two main steps, depositing the junction layers and defining the devices and interconnects between the devices.

Figure 2:
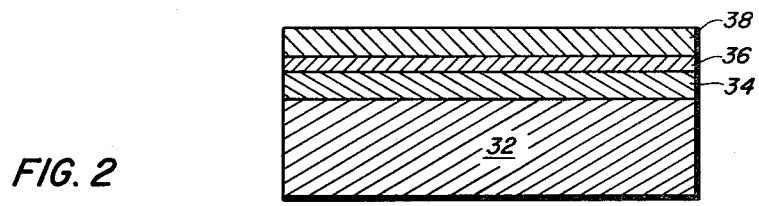
FIG. 2 is a cross section of a chip after the deposition of the active layers as practiced in this invention.

Referring now to the drawings, wherein like reference numerals designate identical or corresponding parts throughout the several views, and more particularly to FIG. 2 thereof.

Figure 1A:
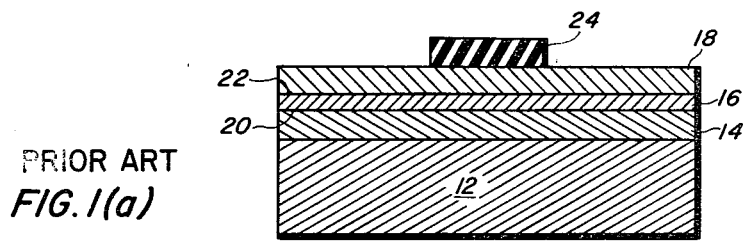
FIG. 1(a) is a cross section of a chip during fabrication as practiced in the prior art.
Figure 1B:
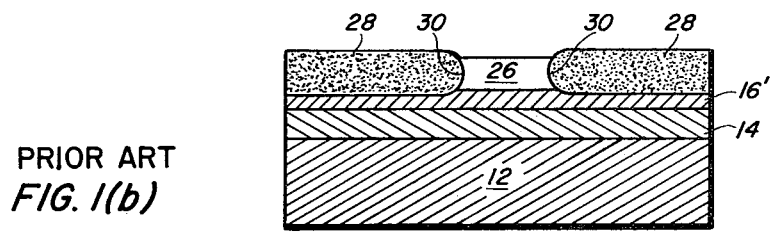
FIG. 1(b) is a cross section of a chip during fabrication after the device has been isolated by anodization as practiced in the prior art.

The macroscopic structure of the chip resulting from the deposition is shown in FIG. 2 and can resemble that shown for the SNAP process shown in FIG. 1(a), i.e. an entire substrate 32 sequentially covered with several layers of different materials.

The invention has been practiced to produce operating Josephson junctions in which the substrate 32 is quartz. A lower superconducting layer 34 is composed of niobium nitride (NbN); an insulating layer 36 is hydrogenated silicon (Si) which is subsequently oxidized; and an upper superconducting layer 38 is also NbN. It is to be appreciated that the structure of FIG. 2 does not distinguish this invention which may be practiced with different materials and even different number of deposited layers. For example, the barrier layer 36 may be metallic for a superconducting device with a quasi-junction barrier.

Figure 3:
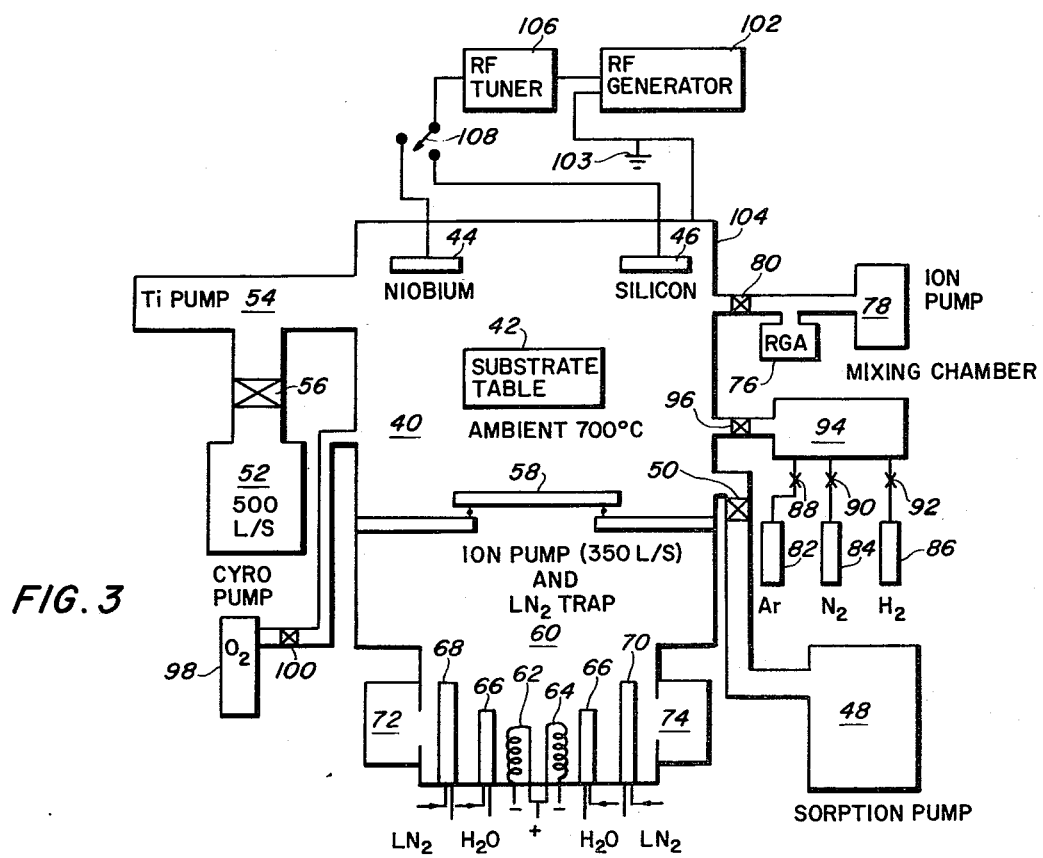
FIG. 3 is a pictorial representation of the ultra-high vacuum system used in depositing the layers of the chip.

The depositions and processing required to create the structure of FIG. 2 took place in an ultra-high vacuum (UHV) system illustrated in FIG. 3 during a single pump-down of the system, i.e., the system was not opened to air between depositions of the layers and only controlled amounts of high-purity gases were valved into the system for depositions and processing.

The UHV system used for the depositions is of a type commercially available and needs to be capable of maintaining a pressure of $1 \times 10^{-9}$ torr. All of the depositions and processing during deposition are performed within a main vacuum chamber 40. Before pump-down the substrate 32 is placed on a table 42 disposed within the main vacuum chamber 40 which can be heated to 700° C. and which is rotatable so that the substrate can be positioned beneath targets 44 and 46 to be described later for use during depositions. After the main vacuum chamber 40 is sealed, a sorption pump 48 is opened through its valve 50 to rough pump the entire system. Then the sorption pump 48 is valved off and a cryopump 52, operating at 500 liters/s, and a titanium sublimation pump 54 are used to further pump-down the main vacuum chamber 40 and maintain a vacuum. The titanium sublimation pump 54 is activated by supplying low-voltage high-current alternating current from its own controller. This pump is usually activated for two minutes every hour and is automatically controlled by its own timer. The cyropump 52 is manually controlled by its own valve 56. Then the main pump valve 58 is opened to the lower pumper chamber 60. Within this chamber is another titanium sublimation pump comprising titanium filaments 62 and a surrounding water cooled shroud 66. Current passing through the titanium filaments 62 and 64 causes titanium to sublimate which condenses on the shroud 66. Surrounding the shroud are liquid nitrogen traps 68 and 70 through which liquid nitrogen flows. Around the periphery of the lower vacuum chamber are located a set of ion pumps 72 and 74 which have a combined pumping speed of 350 liter/s. The main pump valve 58 is not opened until the main vacuum chamber 40 has reached a sufficiently low pressure to allow the ion pumps 72 and 74 to operate. During the pump-down to $1-5 \times 10^{-9}$ torr the entire system is baked at 100° C. for 12 hours. However, a high partial pressure of helium often remains because of its resistance to pumping. Not shown in FIG. 3 are pressure gauges to measure the effectiveness of the vacuum. A residual gas analyzer (RGA) 76 with its own ion pump 78 and valve 80 to the main vacuum chamber 40 is used to measure the composition of gases within the main vacuum chamber 40.

Gases used in the deposition and processing within the UHV system need to be high purity. Separate tanks are provided for argon (Ar) 82, nitrogen ($N_2$) 84 and hydrogen ($H_2$), 86. The flow of these gases are controlled by separate adjustable valves 88, 90, and 92, into a mixing chamber 94 in which multiple gases mix before flowing through an adjustable valve 96 into the main vacuum chamber 40. Oxgen ($O_2$) is supplied in a tank 98 connected through its own valve 100 to the main vacuum chamber 40.

The depositions within the UHV system are done by RF sputtering. An RF generator 102 which has a common ground 103 with the conducting vacuum system case 104 supplies RF power through an RF tuner 106 and a switch 108 to either of the targets 44 and 46. The RF tuner 106 compensates for the mismatched load presented by the targets 44 and 46. Application of RF power to one of the targets 44 and 46 in the presence of a low pressure of Ar, causes that target to sputter.

After the UHV system has been pumped down, a flow of a gas mixture of 10 parts Ar to 1 part $N_2$ is established such that the pressure within the main vacuum chamber is established at 11 microns (1 micron equals $10^{-3}$ torr). The RF generator 102 is turned on and through the Ar, it cleans the Nb target 44 in a presputtering operation.

This Nb target 44, commercially available, is about 15 centimeters in diameter and in structure not shown in FIG. 3 is bonded to a water cooled copper block. After the presputtering has cleaned the Nb target, the table 42 holding the chip and heated to 600°-700° C. is rotated so that the chip lies beneath the Nb target 44. The Nb sputters from the Nb target 44 and interacts with $N_2$ to deposit out on the substrate 32 as NbN to form the lower superconducting layer 34. After about 300 nm of NbN has been deposited, the table 42 is rotated away from the Nb target 44.

The $N_2$/Ar mixture is cut off and the system purges itself through its pumps for about 5 minutes. Then Ar and $H_2$ are mixed in the mixing chamber 94 in the ratio of 300:1 Ar to $H_2$. The gas mixture is then allowed to flow such that the $H_2$ partial pressure within the main vacuum chamber is between $2 \times 10^{-4}$ and $5 \times 10^{-6}$ torr, preferably $5 \times 10^{-5}$ torr. After the silicon (Si) target 46, of the same construction as the Nb target 44, is presputtered, the table 42 is heated to 300° C. and rotated beneath the Si target 46. A hydrogenated Si layer is thereby formed. When this layer has become 4 nm thick, the table 42 is rotated away from the Si target 46 and the flow of the $H_2$/Ar mixture is stopped. Then $O_2$ is allowed to flow into the main vacuum chamber 40 where the hydrogenated silicon layer oxidizes and all pin holes are plugged to form the insulating layer 36. The $O_2$ pressure is maintained at 30 microns, the chip is kept at 300°, and the oxidation continues for 30 minutes.

Some superconducting materials usable for Josephson junctions form good native oxides so that the insulating layer can be formed by oxidizing the lower superconducting layer 34.

After the oxidation is stopped by shutting off the $O_2$, the system is allowed to purge itself for a few hours. The upper superconducting layer 38 is then deposited much like the lower superconducting layer 34, except that the Ar pressure is increased to 20-30 microns, the nitrogen pressure is increased to 2-3 microns, and the upper superconducting layer is deposited to a thickness of 20-50 nm.

The result of the sequential depositions carried out without breaking vacuum is that extraneous contaminants have not had an opportunity to settle at the interfaces between layers. However, because no masking is done between layers, no device definition has been accomplished to this point. However, the processing required to do the masking can involve removing the chip from the UHV chamber since the interfaces are not protected. The processing is somewhat limited in that it can define further structure only from above the already deposited layers.

Figure 4:
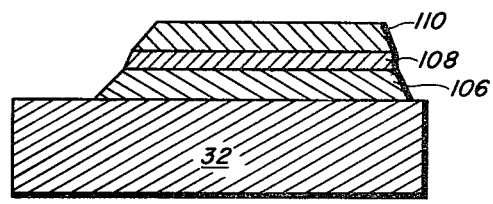
FIG. 4 is a cross section of the chip of FIG. 2 after the base electrode has been sculptured.

The lower superconducting layer 34 shown in FIG. 2 can be sculptured, as shown in FIG. 4, into a base electrode 106 of a desired shape by standard photolithographic processes. In the process of sculpturing the base electrode 106, the barrier layer 36 and upper superconducting layer 38 of FIG. 2 become an insulating layer 108 and a counter layer 110 shown in FIG. 4 of the same general shape as the base electrode 106. The base electrode sculpturing serves to isolate fairly large areas of the chip and the resolution needs not be as precise as that associated with the final elements to be defined on the base electrode 106.

Figure 5:
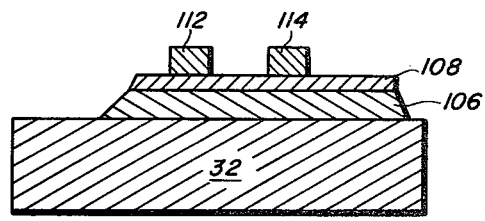
FIG. 5 is a cross section of the chip of FIG. 4 after the counter electrodes have been etched.

In the next series of steps shown in FIG. 5, a set of counter electrodes 112 and 114 are defined in the shape of pedestals over the insulating layer 108 which is then a barrier 108 common to both counter electrodes 112 and 114. Of course any number of counter electrode 112 and 114 can be included in the chip design just as there can be multiple base electrodes 106. The formation of the counter electrodes requires the use of anisotropic etching that extends through the upper superconducting layer 110 shown in FIG. 4. Such etching can be done by dry plasma etching or ion milling. In both methods, a photoresist is usually applied above the upper superconducting layer 110 by photolithographic techniques in the shape of the desired counter electrodes 110 and 114 shown in FIG. 5. The photoresist protects the covered parts of the upper superconducting layer 112 shown in FIG. 4 from the etching process. Both dry plasma etching and on milling are standard techniques for which commercial equipment is available. As practiced for this example, a vacuum chamber is filled with $CF_4$ to about 500 microns of pressure and the $CF_4$ is excited by an RF source. The resultant $F^-$ radical reacts with exposed surfaces and etches the material away. Alternatively argon ions can be accelerated to 1 keV and directed against the exposed surface to ion mill the surface away. Other combinations of accelerated ions and acceleration energies are practiced in ion milling.

The etching must be controlled so that the upper superconducting layer 110 is etched completely through in the non-photomasked areas of FIG. 5. The etching may proceed partly or wholly through the barrier 108 and partially into the counter electrode 106 if such etching does not introduce shorts during the contacting process. The extent of etching can be controlled by establishing etching rates through a known thickness of the same material, here NbN, by the same etching process. Etching rates for many processes on different materials are available in the literature. Alternatively, a mass spectrometer can be attached to the etching chamber. When the mass spectrometer detects a marked increase in the amount of atoms or molecules representative of the barrier 108, the etching is stopped because the counter electrodes 112 and 114 have been totally defined.

Figure 6:
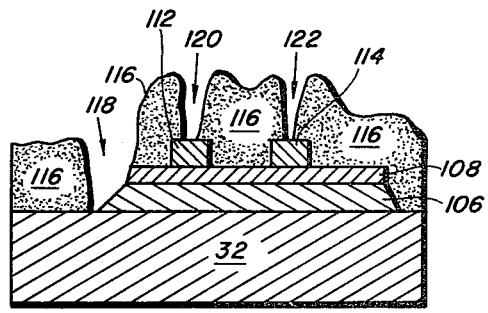
FIG. 6 is a cross section of the chip of FIG. 5 after the field insulator layer has been etched for via holes.

At this point the series of Josephson junctions have been formed, each with a separate counterelectrode 112 or 114 but with a common barrier 108 and a common base electrode 106. However, electrical contacts need to be made to the Josephson junctions. To accomplish this, as shown in FIG. 6, a layer of a field insulator 116, such as 500 nm of zinc oxide (ZnO) or silicon monoxide (SiO) is deposited over the entire chip. Then via holes 118, 120 and 122 are etched through the insulator 116 to the base electrode 106 and to each of the two counter electrodes 112 and 114. The use of SiO for the field insulator 116 requires a lift-off technique to establish the via-holes 118, 120, and 122.

A final coating of superconducting contact material, such as 100 nm of Nb or NbN, is then deposited over the entire chip.

This contact/lead layer provides good contacts to the electrodes and further is used for superconducting interconnects between Josephson junctions or to bonding wires connected off-chip. Both Nb and NbN are superconductors and form good mechanical and electrical bonds to the Nb or NbN base electrode 108 and counterelectrodes 112 and 114.

Figure 7:
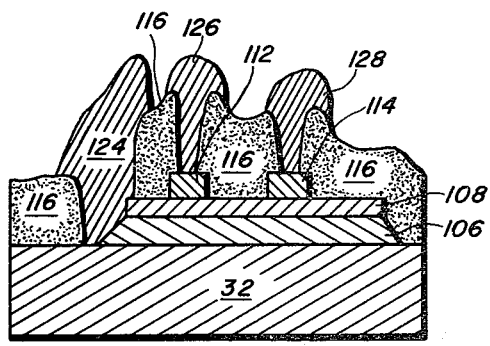
FIG. 7 is a cross section of the chip of FIG. 6 after the contact and lead pattern has been deposited and defined.

A final photolithographic etch produces a contact pattern shown in FIG. 7 in the contact material that provides for a base contact 124 to the base electrode 106, and counter contacts 126 and 128 to each of the counter electrodes 112 and 114. The contacts, 124, 126, and 128 can be extended outside the via holes 118, 120, and 122 shown in FIG. 6 onto the top of the field insulator 116 to form leads to other parts of the integrated circuits or to form pads for wire bonding.

Figure 8:
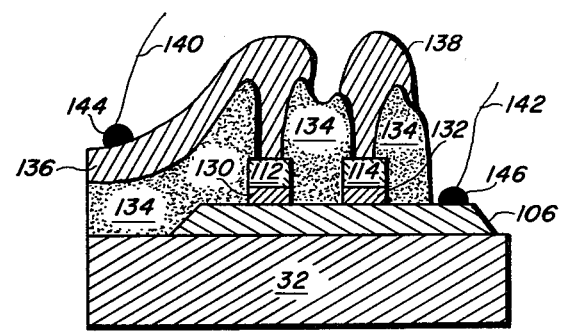
FIG. 8 is a cross section of the chip of FIG. 2 in which an alternate method of isolating and contacting the electrodes is used.

Another example of the post-deposition process used in this invention is shown in FIG. 8. The depositions and definition of the base electrode 106 can be carried out as previously described. The anistoropic etching is then carried through both the upper superconducting layer 110 and the insulating layer 108 shown in FIG. 4 so that the pedestals shown in FIG. 8 for each Josephson junction contains a free standing barrier 130 or 132 and counter-electrodes 112 or 114. An insulator 134 is deposited and then selectively etched back to open up the counter electrodes 112 and 114. A contact material deposition is etched back to form a set of contact/leads 136 and 138 for each electrode 112 and 114. A superconducting wire 140 can be bonded to the contact/lead 136. The bonding to contact/lead 138 is not shown. The base electrode 106 can be bonded directly with a superconducting wire 142 at points where neither insulating nor lead material was left. A bead of indium 144 and 146 forms a good bond between the superconducting wire 140 or 142 and the contact/lead 136 or base electrode 106.

Figure 9:
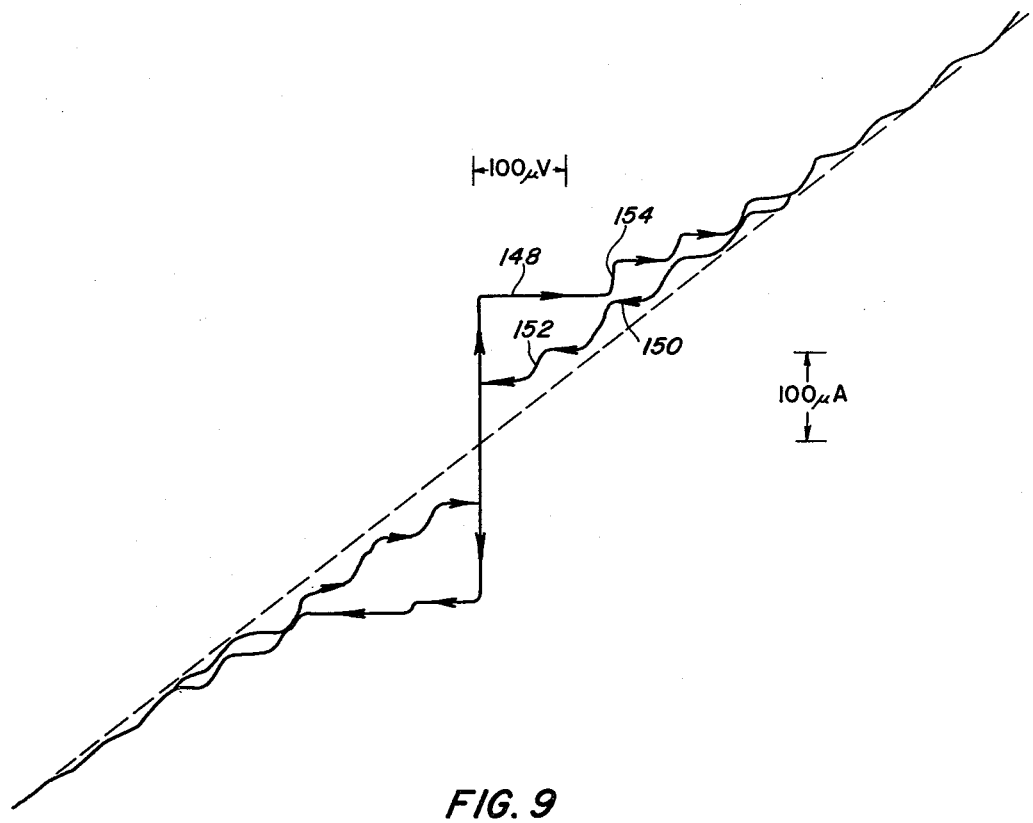
FIG. 9 is a plot of the current-voltage characteristics of a Josephson junction fabricated by the example of the disclosure.

A series of Josephson junctions have been built according to the foregoing description. The I-V characteristics for one such device are shown in FIG. 9 for an operating temperature of 4.2° K. This device, of 50 micrometers on a side was grown with a $H_2$ pressure of $1.6 \times 10^{-5}$ torr during the Si deposition during which the chip was kept at 150° C. The DC current-voltage curve exhibits hysteresis representative of a low beta Josephson junctions in that the curve 148 for an upward ramp in voltage differs from the curve 150 for a downward ramp. The appearance of steps 152 and 154 is also representative of Fiske modes commonly observed in large Josephson junctions. Their existence is explainable in terms of the cavity modes within the junction beating with the Josephson frequency f. The relation between voltage and frequency is given by $$f = 2e \, V/h. \qquad (1)$$

where the frequency is the resonant frequency determined by the dimensions of the device. The amount of hysteresis, the number of steps and the size of the steps vary with the fabrication parameters.

It should be appreciated that while the foregoing discussion has centered on fabrication of Josephson junction integrated circuits, the described processes are not so limited. A single Josephson junction could be built by the same techniques and be likewise free of interfacial contaiminants. Furthermore, the technique could be used for fabricating semiconductor devices intended for operation at non-superconducting temperatures. The composition and thicknesses of the layers would of course depend on the type of semiconductor device required. The described processing would allow fabrication of semiconductor devices unusually free of interfacial contaminants and defects.

Some examples of semiconductor devices for which this invention would be useful are mesa-transistors, either of homojunction or heterojunction construction, and three junction devices such as a Shockley diode or a silicon controlled rectifier. Superlattice structures can also be built with many layers of alternating semiconductor composition. Furthermore, high quality and stable tunnel junction can be built using this invention.

What has been described is a method of fabricating electronic devices, particularly Josephson junctions of refractory superconductors, that provides for interfaces unusually free of contaminants and defects. The active layers are deposited within an ultra-high vacuum system during a single pump-down of the system. The devices are subsequently delineated by anisotropic etching through one or more of the deposited layers.

What is claimed and desired to be secured by Letters Patent of the United States is:

1. A method of fabricating a Josephson junction integrated circuit device with contamination-free interfaces, comprising the steps of:

providing a quartz substrate located in an ultra-high vacuum chamber;

pumping said ultra-high vacuum chamber down to an ultra-high vacuum on the order of $1-5 \times 10^{-9}$ torr;

depositing by RF sputtering onto said quartz substrate a 300 nm lower layer of NbN, said lower layer being deposited at 600°–700° C. under a partial pressure of Ar on the order of $11 \times 10^{-3}$ torr;

depositing by RF sputtering at 300° C. a 4 nm layer of hydrogenated silicon onto said lower layer of NbN;

oxidizing said layer of hydrogenated silicon in an oxygen atmosphere at 300° C.;

depositing by RF sputtering onto said hydrogenated silicon layer a 20–50 nm upper layer of NbN, said upper layer being deposited under a partial pressure of Ar in the range of $20-30 \times 10^{-3}$ torr, all said depositing and oxidizing steps being done in said ultra-high vacuum chamber during a single pump-down thereof;

sculpturing by anisotropic etching said deposited and oxidized layers to form base electrodes;

anisotropically etching through said upper layer and said oxidized silicon layer to form pedestals of counter electrodes and barriers;

depositing a 500 nm layer of ZnO over said device;

etching via holes through said ZnO layer to the base and counter electrodes;

depositing a 100 nm layer of a contact/lead superconducting material over said device, said contact/lead layer contacting said base and counter electrodes through said via holes in said ZnO layer; and etching said contact/lead layer to form a contact and lead pattern.

2. A method of fabricating a Josephson junction integrated circuit as recited in claim 1, wherein said step of anisotropic etching comprises dry plasma etching.

3. A method of fabricating a Josephson junction integrated circuit as recited in claim 1, wherein said step of anisotropic etching comprises ion milling.

4. A method of fabricating a Josephson junction integrated circuit, as recited in claim 1, wherein said contact/lead layer consists essentially of Nb.

5. A method of fabricating a Josephson junction integrated circuit, as recited in claim 1, wherein said contact/lead layer consists essentially of NbN.

* * * * *